United States Patent [19]
Tsuruda et al.

[11] Patent Number: 5,734,614
[45] Date of Patent: Mar. 31, 1998

[54] DYNAMIC SEMICONDUCTOR MEMORY DEVICE USING SENSE AMPLIFIER AS CACHE MEMORY

[75] Inventors: Takahiro Tsuruda; Kazutami Arimoto, both of Hyogo, Japan

[73] Assignee: Mitsubishi Denki Kabushiki Kaisha, Tokyo, Japan

[21] Appl. No.: 780,010

[22] Filed: Dec. 23, 1996

Related U.S. Application Data

[63] Continuation of Ser. No. 605,406, Feb. 22, 1996, abandoned.

[30] Foreign Application Priority Data

Jun. 8, 1995 [JP] Japan .................... 7-141989

[51] Int. Cl.⁶ .................................................. G11C 8/00
[52] U.S. Cl. .................... 365/189.05; 365/230.03; 365/230.06; 365/63
[58] Field of Search ........................ 365/189.05, 230.03, 365/230.06, 51, 63, 194, 195

[56] References Cited

U.S. PATENT DOCUMENTS 5,406,526  4/1995  Shugibayashi et al. ......... 365/230.03
5,416,748  5/1995  Fujita ......................... 365/230.06
5,446,693  8/1995  Okamoto ...................... 365/230.06

FOREIGN PATENT DOCUMENTS 1-124193  5/1989  Japan .

*Primary Examiner*—Vu A. Le
*Attorney, Agent, or Firm*—Lowe, Price, LeBlanc & Becker

[57] ABSTRACT

A DRAM includes a word driver unit, a subword driver block, a memory array block, a control circuit, a decode circuit, an equalize block, a sense amplifier block, and an I/O switch unit. A plurality of main word line run through the memory array block. A plurality subword lines are connected to each main word line. A division word line structure and an address non-multiplex method are applied in the DRAM. Therefore, the sense amplifier block can be used as a cache memory. The number of ways of the cache can be increased to improve the hit rate without increase in the chip area.

15 Claims, 7 Drawing Sheets

DYNAMIC SEMICONDUCTOR MEMORY DEVICE USING SENSE AMPLIFIER AS CACHE MEMORY

This application is a continuation of application Ser. No. 08/605,406 filed Feb. 22, 1996 now abandoned.

BACKGROUND OF THE INVENTION

1. Field of the Invention

The present invention relates to a dynamic semiconductor memory device incorporating a cache memory, and more particularly, to a dynamic semiconductor memory device using a sense amplifier as a cache memory.

2. Description of the Background Art

A conventional dynamic semiconductor memory device incorporating a cache memory is disclosed in, for example, Japanese Patent Laying-Open No. 1-124193.

A cache memory will first be described. In order to improve the cost performance of a computer system, a high speed memory of a small capacity is provided as a high speed buffer between a main memory formed of a dynamic random access memory (referred to as DRAM hereinafter) of low speed and large capacity and a central processing unit (CPU) in many cases.

This high speed buffer is called a cache memory. A data block having a high possibility of being used by the CPU is copied from the main memory and stored in such a cache memory. A "hit" implies that data stored in the address of a DRAM to be accessed by the CPU is present in the cache memory. In the case of a hit, the CPU accesses the high speed cache memory.

A "cache miss" implies the case where data stored in the address requested to be accessed by the CPU is not present in the cache memory. The CPU accesses the low speed main memory and transfers the block to which that data belongs to the cache memory.

FIG. 8 is a schematic block diagram showing a conventional DRAM incorporating the above-described cache memory.

Referring to FIG. 8, a conventional DRAM with a cache memory includes a DRAM main memory cell array 501, a word driver unit 503, a row decoder unit 505, a sense amplifier unit 507, an I/O switch unit 509, a column decoder unit 511, a row address buffer 513, a column address buffer 515, an output buffer 517, an input buffer 519, a transfer gate unit 521, an SRAM (Static Random Access Memory) memory cell array 523, a block decoder 525, a way decoder 527, and a way address buffer 529.

In DRAM memory cell array 501 of FIG. 8, a plurality of word lines and a plurality of bit line pairs not shown are arranged so as to cross each other. A memory cell is provided at each crossing thereof. A word line of DRAM memory cell array 501 is connected to row decoder unit 505 via word driver unit 503. A bit line pair of DRAM memory cell array 501 is connected to sense amplifier unit 507 and column decoder unit 511 via I/O switch 509.

Row address buffer 513 is connected to row decoder 505. Column address buffer 515 is connected to column decoder unit 511. A multiplex address signal MPXA which is row address signal RA multiplexed with column address signal CA is applied to row and column address buffers 513 and 515. Output buffer 517 and input buffer 519 are connected to I/O switch unit 509.

DRAM memory cell array 501 is divided into a plurality of blocks formed of a plurality of rows of memory cells on each address space thereof. DRAM memory cell array 501 is divided into four blocks of B1–B4 in FIG. 8.

Transfer gate unit 521 and SRAM memory cell array 523 are provided between sense amplifier unit 507 and I/O switch unit 509. Furthermore, block decoder 525 and way decoder 527 are provided. A part of column address signal CA is supplied from column address buffer 515 according to the number of blocks to block decoder 525. Block decoder 525 is activated according to a cache hit signal CH.

A way address signal WA is applied to way decoder 527 via way address buffer 529. Way decoder 527 responds to way address signal WA to selectively drive a word line in SRAM memory cell array 523.

SRAM memory cell array 523 includes a plurality of word lines not shown. A plurality of SRAM memory cells not shown are connected to each of the plurality of word lines.

Block decoder 525 provides a transfer signal to a block of transfer gate unit 521 corresponding to each block, whereby data of the same one row are transferred from DRAM memory cell array 501 in units of a block to SRAM memory cell array 523.

Upon the selection of any of the plurality of word lines in SRAM memory cell array 523 by way decoder 527 in response to way address signal WA via way address buffer 529, data stored in each of the plurality of SRAM memory cells connected to the selected word line is read out to a corresponding bit line pair not shown. The data at the bit line pair is read out to an input/output line not shown in response to the provision of a column select signal from column decoder unit 511 to I/O switch unit 509.

According to this DRAM, a plurality of data blocks of different rows with one row of data of a plurality of columns as one data block are maintained in a plurality of SRAM memory cells of SRAM memory cell array 523, while data blocks of the same column corresponding to different rows are maintained on SRAM memory cell array 523 simultaneously. Thus, SRAM memory cell array 523 is used as a cache memory.

A cache hit will be described hereinafter. Cache hit signal CH of an H level is applied to one input node of an AND gate 531. Therefore, column address signal CA is not applied to block decoder 525. Accordingly, DRAM memory cell array 501 is isolated from SRAM memory cell array 523. One row of data corresponding to way address signal WA are read out from each of the plurality of SRAM memory cells to a corresponding bit line pair.

A cache miss will be described hereinafter. Data of the block including the accessed memory cells are transferred at one time to a block of SRAM memory cells selected by way address signal WA in SRAM memory cell array 523. Thus, the stored contents in the SRAM memory cells of this block are rewritten.

As described above, a conventional DRAM with a cache memory includes a SRAM memory cell array 523, as well as way decoder 527 and way address buffer 529. It is also necessary to provide a great number of way decode outputs in order to increase the number of ways. Therefore, the complexity of the way decoder is increased.

Thus, there was a problem that the chip area and the number of particular signals (output of way decoder, way address, and the like) are increased.

In an address multiplex DRAM not employing the structure of a divided word line (DWL), a sense amplifier can be used as a cache memory.

In this case, the number of ways is reduced. There was a problem that the cache hit rate is low.

In an address multiplex system, a row address and a column address towards a DRAM are entered with a predetermined time period therebetween.

SUMMARY OF THE INVENTION

In view of the foregoing, an object of the present invention is to provide a dynamic semiconductor memory device having a greater number of ways of a cache to improve the hit rate without increasing the chip area.

Another object of the present invention is to provide a dynamic semiconductor memory device that can carry out a readout operation at high speed.

A further object of the present invention is to provide a simple dynamic semiconductor memory device incorporating a cache memory.

According to an aspect of the present invention, a dynamic semiconductor memory device to which a row address and a column address are entered simultaneously includes a memory cell array divided into a plurality of memory array blocks, each having a plurality of dynamic memory cells, a plurality of main word lines passing through the plurality of memory array blocks, and a plurality of bit line pairs provided in a direction crossing a main word line in each of the plurality of memory array blocks, and connected to the plurality of memory cells in a corresponding memory array block. Each memory array block includes a plurality of subword lines connected to the plurality of memory cells in the relevant memory array block, the plurality of subword lines being divided into a plurality of groups, each group of subword lines being connected to a corresponding on of the plurality of main word lines. The memory cell array includes a plurality of subword line drive blocks provided corresponding to each of the plurality of memory array blocks. Each of the plurality of subword line drive blocks includes a plurality of subword line drive circuits provided corresponding to the plurality of subword lines for driving a plurality of subword lines. The dynamic semiconductor memory device further includes a plurality of sense amplifier blocks provided corresponding to the plurality of memory array blocks, and an information retain control circuit. Each sense amplifier block amplifies the plurality of data readout to the plurality of bit line pairs. When data of an address that is requested to be accessed is not present in any of the plurality of sense amplifier blocks, the information retain control circuit causes data to be read out from the memory cell of the address that is requested to be accessed, and retains the plurality of amplified data in a sense amplifier block corresponding to a memory array block other than the memory array block with the memory cell of the address which is requested to be accessed. When data of an address that is requested to be accessed is present in any of the plurality of sense amplifier blocks, the information retain control circuit retains the plurality of amplified data present in each of the plurality of sense amplifier blocks. The dynamic semiconductor memory device further includes a readout circuit for reading out data held in the plurality of sense amplifier blocks.

In the dynamic semiconductor memory device of the present invention, each sense amplifier block amplifies and retains a plurality of data read out to a plurality of bit line pairs from the plurality of memory cells in a corresponding memory array block. Each sense amplifier block amplifies and retains a plurality of data for every corresponding memory array block, i.e. for every subword line of a plurality of memory cell blocks.

When the data of the requested address does not exist in any of the plurality of sense amplifier blocks in the next access, the information retain control circuit effects data readout from the memory cell of the address that is requested to be accessed.

Here, the information retain control circuit does not read out data from a memory cell of a memory array block other than the memory array block including the memory cell of the address that is requested to be accessed. A corresponding sense amplifier block retains the original plurality of amplified data. The information retain control circuit can control each sense amplifier block for every corresponding memory array block since a row address and the column address are entered at the same time.

When data of the address that is requested to be accessed is present in any of the plurality of sense amplifier blocks, the information retain control circuit causes the readout circuit to read out data of the address that is requested to be accessed directly from the sense amplifier block, without reading out data from the memory cell of the address that is requested to be accessed.

Here, the information retain control circuit still retains the plurality of data in each of the plurality of sense amplifier blocks.

Therefore, a plurality of data for every memory array block, i.e. for every subword line of a plurality of memory array blocks can be retained in a corresponding sense amplifier block, so that a plurality of sense amplifier blocks can be used as a cache memory.

Therefore, the number of ways of the cache can be increased to improve the hit rate without increase of the chip area.

Preferably, when data of an address that is requested to be accessed is present in any of the plurality of sense amplifier blocks, the information retain control circuit does not activate any of the plurality of main word lines and the plurality of subword lines. The readout circuit reads out data from the sense amplifier block including the relevant data when data of an address that is requested to be accessed is present in any of the plurality of sense amplifier blocks at a timing faster than the case where data is not present in a sense amplifier block.

Thus, when data of an address to which access is requested is present in any of the plurality of sense amplifier blocks, the time required for activating a main word line and the subword line to read out data from a memory cell, and the time required for amplifying the data read out to a bit line pair in a sense amplifier block can be eliminated.

This means that subsequent data readout can be advanced to allow high speed access.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A dynamic random access memory (referred to as DRAM hereinafter) as a dynamic semiconductor memory device of the present invention will be described hereinafter with reference to the drawings.

First, a structure of an address non-multiplex DRAM employed in the present invention will be described. In an address non-multiplex system, a row address and a column address are entered simultaneously.

Figure 1:
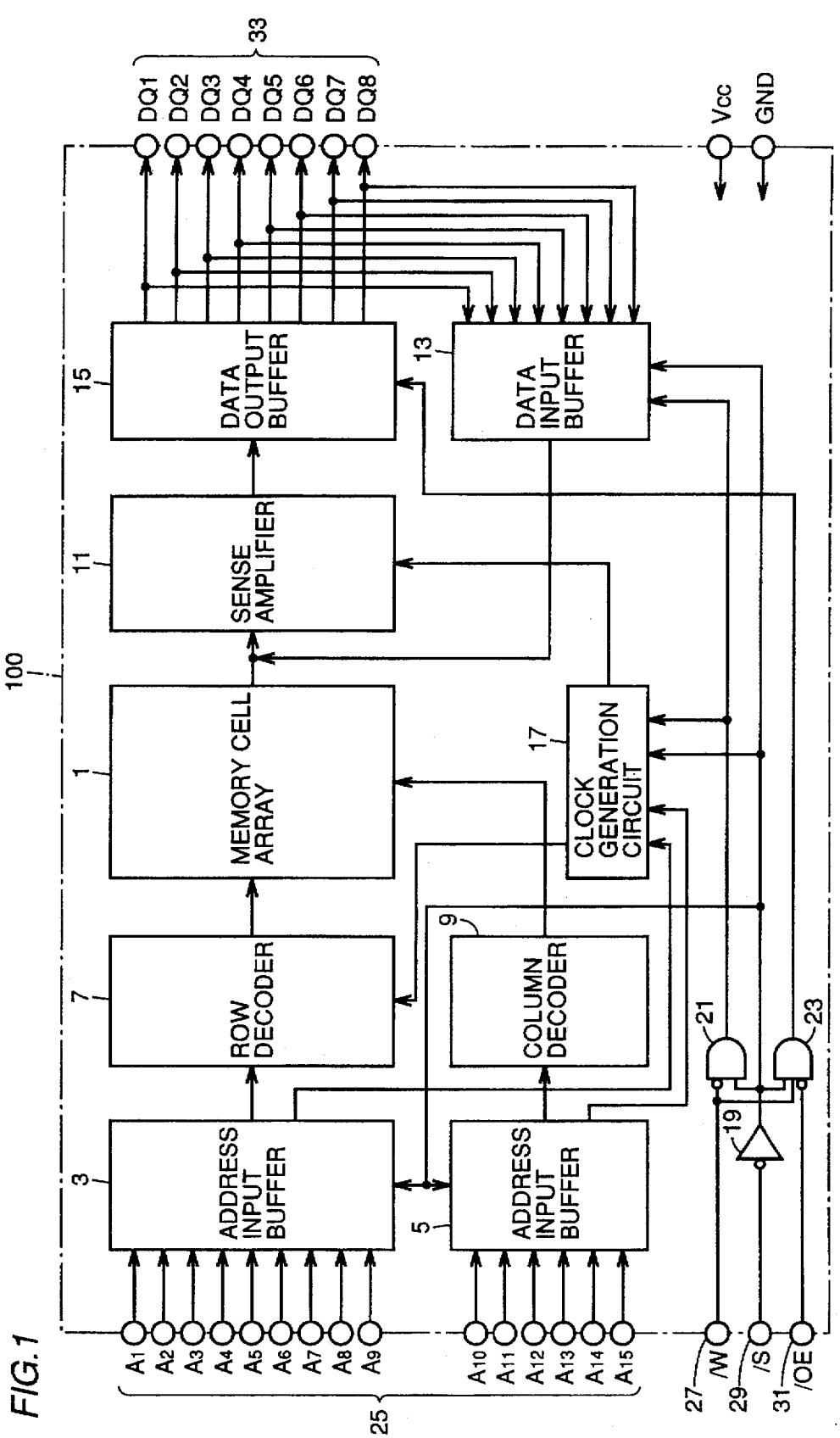
FIG. 1 is a block diagram showing an entire structure of an address non-multiplex DRAM.

FIG. 1 is a block diagram showing an entire structure of an address non-multiplex DRAM.

Referring to FIG. 1, an address non-multiplex DRAM 100 includes a memory cell array t, address input buffers 3, 5, a row decoder 7, a column decoder 9, a sense amplifier 11, a data input buffer 13, a data output buffer 15, a clock generation circuit 17, an inverter 19, AND gates 21 and 23, an address input terminal 25, signal input terminals 27, 29, 31, and a data input/output terminal 33.

Memory cell array 1 includes a plurality of memory cells for storing information. Row decoder 7 responds to an applied address signal to specify a row in memory cell array 1. A word line (not shown) is selected for this specification. Column decoder 9 responds to an applied address signal for specifying a column in memory cell array 1. A bit line pair (not shown) is selected for this specification.

Address input buffer 3 receives row addresses A1, A2, . . . from address input terminal 25. Address input buffer receives column addresses A10, A11, . . . from address input terminal 25.

Address input buffer 3 provides the received address as an internal row address signal to row decoder 7 and clock generation circuit 17. Address input buffer 5 provides the received column address as an internal column address signal to column decoder 9 and clock generation circuit 17.

In a readout operation, data readout from a selected memory cell in memory cell array 1 is sensed and amplified by sense amplifier 11 to be provided to data input/output terminal 33 via data output buffer 15. Data DQ1–DQ8 provided to data input/output terminal 33 are provided to the outside world.

In a write operation, data DQ1–DQ8 applied from data input/output terminal 33 are written into a selected memory cell in memory cell array 1 via data input buffer 13.

A chip select signal /s is applied from signal input terminal 29 to be applied to AND gates 21 and 23 via inverter 19. A write specify signal /W is applied from signal input terminal 27. An output enable signal /OE is applied from signal input terminal 31. AND gate 21 also receives a write specify signal /WE. AND gate 23 also receives output enable signal /OE. An output signal of AND gate 21 is provided to gate generation circuit 17 and data input buffer 13. An output signal of AND gate 23 is provided to data output buffer 15.

An output signal of inverter 19 is applied to address input buffers 3 and 5, clock generation circuit 17, and data input buffer 13. Clock generation circuit 17 responds to various applied signals to generate a clock signal. A clock signal generated by clock generation circuit 17 is applied to row decoder 7 and sense amplifier 11.

Address input buffers 3 and 5 operate in response to an output signal of inverter 19. Row decoder 7 and sense amplifier 11 operate in response to a clock signal provided from clock generation circuit 17. Data input buffer 13 operates in response to an output signal of AND gate 21 and an output signal of inverter 19. Data output buffer 15 operates in response to an output signal of AND gate 23.

In DRAM 100 of the above structure, a row address and a column address are entered at the same time. A word line and a bit line are selected in memory cell array 1 according to the entered row and column addresses, whereby a memory cell is selected.

Then, a normal operation of data read/write, and a refresh operation for refreshing data stored in a memory cell can be carried out.

Figure 2:
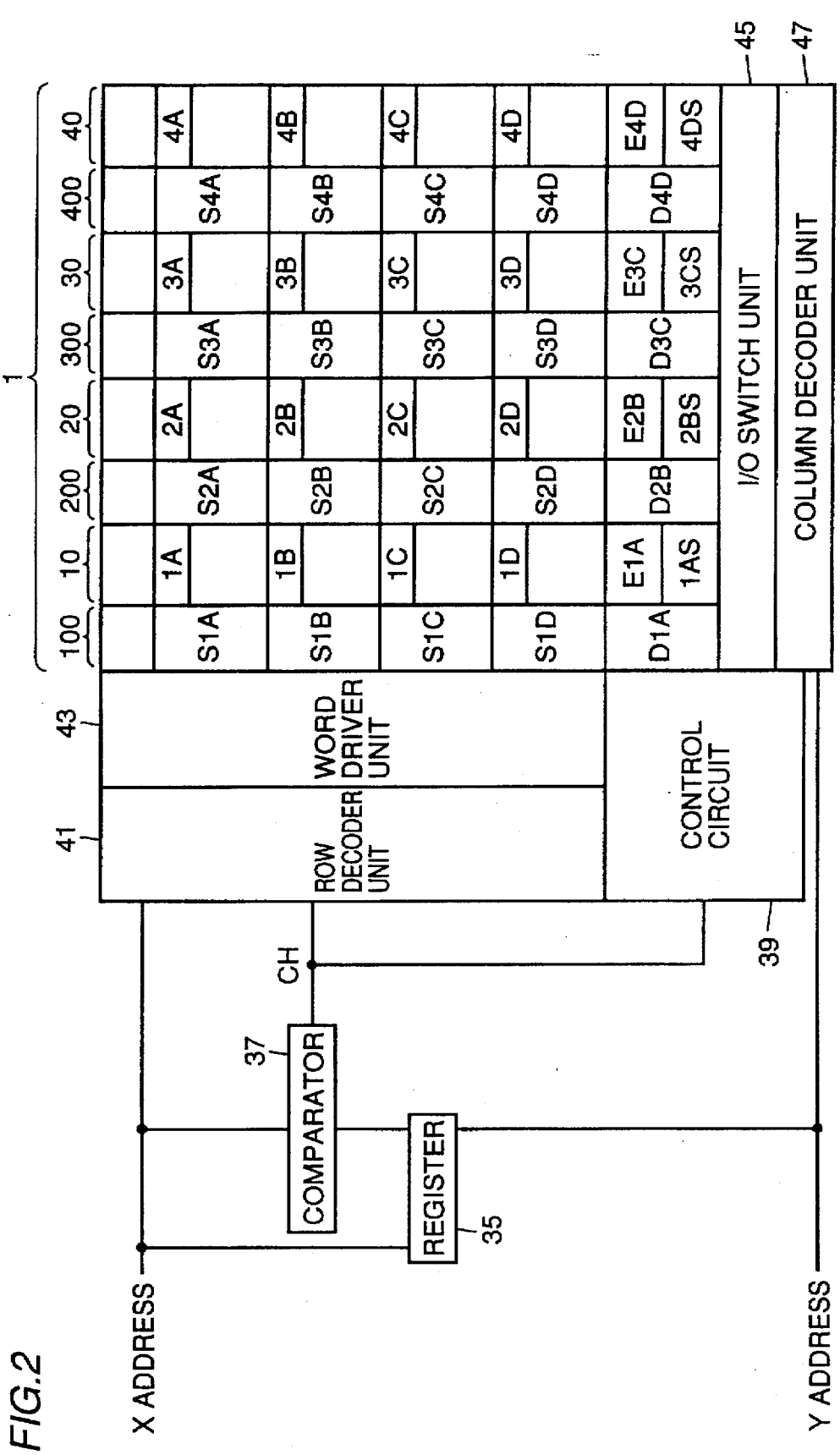
FIG. 2 is a block diagram showing a structure of a DRAM incorporating a cache memory according to an embodiment of the present invention.

FIG. 2 is a block diagram showing a structure of a DRAM according to an embodiment of the present invention.

The DRAM of the present embodiment employs an address non-multiplex system, similar to that described with reference to FIG. 1. More specifically, a row address and a column address are entered simultaneously. Furthermore, a division word line (DWL) structure which will be described in detail afterwards is employed.

Referring to FIG. 2, a DRAM includes a register 35, a comparator 37, a control circuit 39, a row decoder unit 41, a word driver unit 43, an I/O switch unit 45, a column decoder unit 47, equalize blocks E1A, E2B, E3C, E4D, sense amplifier blocks 1AS, 2BS, 3CS, 4DS, decode circuits D1A, D2B, D3C, D4D, and a memory cell array 1.

Memory cell array 1 includes memory array blocks 10, 20, 30, 40, and subword driver blocks 100, 200, 300 and 400.

Memory array block 10 includes subblocks 1A, 1B, 1C, and 1D. Memory array block 20 includes subblocks 2A, 2B, 2C, and 2D. Memory array block 30 includes subblocks 3A, 3B, 3C and 3D. Memory array block 40 includes subblocks 4A, 4B, 4C and 4D.

Subword driver block 100 includes subword driver circuits S1A, S1B, S1C, and S1D. Subword driver block 200 includes subword drivers S2A, S2B, S2C, and S2D. Subword driver block 300 includes subword driver circuits S3A, S3B, S3C, and S3D. Subword driver blocks 400 includes subword driver circuits S4A, S4B, S4C, and S4D.

Although not shown, a plurality of main word lines are arranged in memory cell array 1. Furthermore, a plurality of subword lines not shown are arranged parallel to each of the plurality of main word lines. A plurality of bit line pairs not shown are disposed crossing the plurality of subword lines. A memory cell not shown is provided at each crossing.

Equalize block E1A equalizes a plurality of bit line pairs of memory array block 10 or a plurality of bit line pairs of memory array block 10 and sense amplifier block 1AS according to a signal from decode circuit D1A. The same applies for equalize blocks E2B, E3C, E4D. Decode circuits D1A, D2B, D3C, D4D are controlled according to a signal from control circuit 39.

Row decoder unit 41 corresponds to a portion of an entered X address (row address) to select one main word line. Word driver unit 43 drives a selected main word line.

One main word line is disposed in the direction of arrangement of subblocks 1A, 2A, 3A and 4A. A plurality of subword lines are arranged for every of subblocks 1A–4A with respect to that one main word line. The same applies for subblocks 1B–4B, subblocks 1C–4C, and subblocks 1D–4D.

Subword driver S1A selects one of the plurality of subword lines in subblock 1A according to a portion of an input X address (row address) and a portion of an input Y address (column address). Here, it is assumed that the main word line passing through subblock 1A is selected. A plurality of data is readout from the plurality of memory cells connected to the selected subword lines into each of the corresponding plurality of bit line pairs. Sense amplifier block 1AS amplifies and retains the data readout to the plurality of bit line pairs.

The same applies for subword driver circuits S2A–S4D and sense amplifier blocks 2BS–4DS.

Column decoder unit 47 selects one row of data retained in each of the plurality of sense amplifier blocks 1AS–4DS according to a portion of an input Y address (column address). The selected data is provided outside via I/O switch unit 45.

Register 35 stores X and Y addresses (row and column addresses) when access is requested. More specifically, the address of data stored in sense amplifier blocks 1AS–4DS are stored.

Comparator 37 compares the address that is requested to be accessed and the address stored in register 35 to determine whether the addresses match each other. When determination is made that the addresses match, i.e. when determination is made that the data of the address that is requested to be accessed is present in any of sense amplifier blocks 1AS–4DS, a cache hit signal CH of an L level (logical low) is applied to row decoder unit 41 and control circuit 39.

When determination is made in comparator 37 that the address requested to be accessed does not match the address stored in register 35, i.e. when determination is made that data of the address requested to be accessed is not present in any of sense amplifier blocks 1AS–4DS, a cache hit signal CH of an H level (logical high) is provided to row decoder unit 41 and control circuit 39.

When comparator 37 determines that the addresses match, I/O switch unit 45 directively reads out data from the sense amplifier block retaining the data of the relevant address. Here, data is still retained in sense amplifier blocks 1AS–4DS.

When comparator 37 determines that there is no match, data is read out from the memory cell of the address that is requested to be accessed. In this case, data of other memory cells connected to the same subword line are read out at the same time.

The plurality of data newly read out to each of the plurality of bit line pairs are amplified and retained in corresponding sense amplifier blocks. Here, data is not newly read out from the sense amplifier blocks corresponding to memory array blocks other than the relevant memory array block including the memory cells from which data is read out. In other words, the other sense amplifier blocks keep the former data.

In the present embodiment, data is read out from a memory cell for every memory array block. By storing data in respective sense amplifier blocks 1AS–4DS corresponding to each of memory array blocks 10–40, sense amplifier blocks 1AS–4DS can be used as a cache memory.

This is possible due to the application of a division word line structure and an address non-multiplex system in the present embodiment. In the case of an address multiplexed system, an Y address (column address) is entered after input of an X address (row address). Therefore, data will be read out from all the subblocks when the main word line passing through subblocks 1A–4A is selected. This means that sense amplifier blocks including data of an address that is not requested to be accessed will store new data. Since the data held in all the sense amplifier blocks will be updated for every readout operation from a memory cell, there is hardly no benefit in using a sense amplifier block as a cache memory. The same can be said for an DRAM that does not employ a DWL structure. Furthermore, the data readout operation is delayed in an address multiplex system since an Y address (column address) is entered after an input of an X address (row address).

Figure 3:
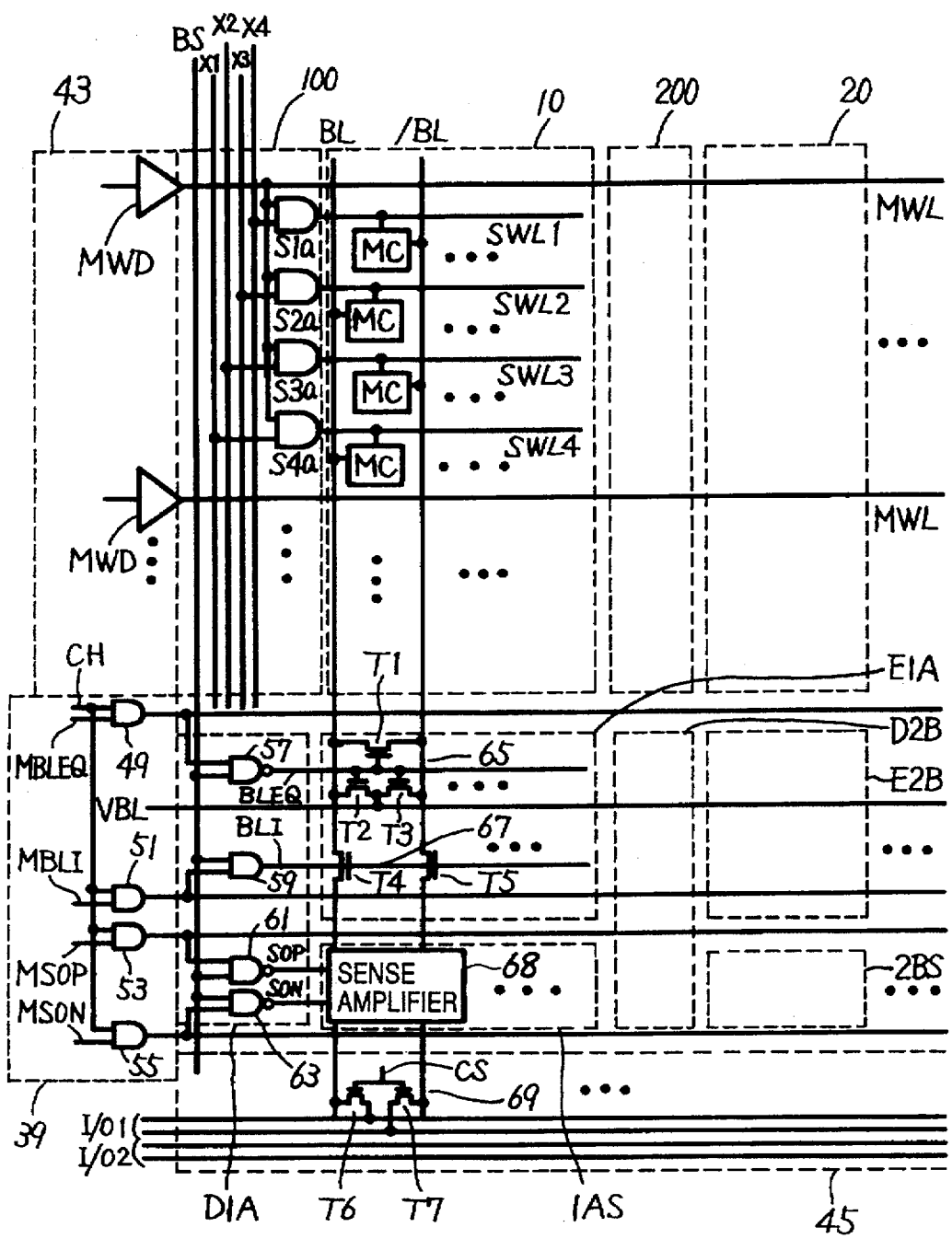
FIG. 3 is a circuit diagram showing in detail a structure of a DRAM incorporating a cache memory according to an embodiment of the present invention.

FIG. 3 is a circuit diagram showing in detail a structure of the DRAM of FIG. 2.

Referring to FIG. 3, the DRAM includes a word driver unit 43, a plurality of subword driver blocks 100, 200 . . . a plurality of memory array blocks 10, 20 . . . , a plurality of main word lines MWL, a plurality of bit line pairs BL, /BL, a control circuit 39, a plurality of decode circuits D1A, D2B, . . . , a plurality of equalize blocks E1A, E2B . . . , a plurality of sense amplifier blocks 1AS, 2BS, . . . , and an I/O switch unit 45.

Word driver unit 43 includes a plurality of word drivers MWD. Subword driver block 100 includes subword drivers S1a, S2a, S3a, S4a, and a plurality of subword driver circuits. Here, word drivers S1a, S2a, S3a, and S4a, for example, form subword driver circuit S1A of FIG. 2.

Memory array block 10 includes a plurality of memory cells MC, and a plurality of subword lines SWL1–SWL4, . . . Here, four memory cells MC and subword lines SWL1–SWL4, for example, form subblock 1A of FIG. 2.

Control circuit 39 includes a plurality of AND gates 49, 51, 53 and 55. Decode circuit D1A includes art AND circuit 59 and a plurality of NAND circuits 57, 61 and 63.

Equalize block E1A includes a plurality of equalize circuits 65 formed of a plurality of n channel transistors (referred to as "transistor" hereinafter) T1, T2, T3, and a plurality of connection control circuits 67 formed of a plurality of n channel transistors (referred to as "transistor" hereinafter) T4, T5.

Sense amplifier block 1AS includes a plurality of sense amplifiers 68. I/O switch unit 45 includes a plurality of I/O switches 69 formed of a plurality of n channel transistors (referred to as "transistor" hereinafter) T6, T7, and a plurality of input/output lines I/01 and I/02. Component corresponding to those of FIG. 2 have the same reference characters allotted, and their description will not be repeated.

Each main word line MWL is driven by a corresponding main word driver MWD. A plurality of subword lines SWL1–4 are provided corresponding to each of the plurality of main word lines MWL. One set of subword lines SWL1–SWL4 are connected to a corresponding one main word line MWL via respective subword drivers S1a–S4a.

Subword lines SWL1–SWL4 are driven by a corresponding one of subword drivers S1a–S4a. Each of subword drivers S1a–S4a corresponding to each set of sub word lines SWL1–SWL4 is an AND gate receiving an input signal set forth in the following.

Subword driver S1a receives a potential of a corresponding main word line MWL, and a decode signal X4 according to a row address (X address) and a column address (Y address). Subword driver S2a receives a potential of a corresponding main word line MWL and a decode signal X3 according to a row address (X address) and a column address (Y address).

Subword driver S3a receives a potential of a corresponding main word line MWL, and a decode signal X2 according to a row address (X address) and a column address (Y address). Subword driver S4a receives a potential of a corresponding main word line MWL and a decode signal X1 according to a row address (X address) and a column address (Y address).

Decode signals X1–X4 are generated by a subword driver control circuit that will be described afterwards.

A plurality of sense amplifiers 68 are provided corresponding to each of the plurality of bit line pairs BL, /BL.

Equalize circuit 65 is provided corresponding to each pair of bit lines BL and /BL. Equalize circuit 65 functions to equalize the potential of a corresponding bit line pair and sense amplifier 68. In each equalize circuit 65, transistor T1 is connected between bit lines BL and /BL. Transistors T2 and T3 are connected in series between bit lines BL and /BL.

Connection control circuit 67 is provided corresponding to each bit line pair BL, /BL. Connection control circuit 67 is provided between a corresponding equalize circuit 65 and a corresponding sense amplifier 68. Each bit line pair BL, /BL is connected to a corresponding sense amplifier 68 via respective connection control circuit 67. Transistor T4 forming connection control circuit 67 is connected between one of bit lines BL and /BL and sense amplifier 68. Transistor B5 is connected between the other of bit lines BL and /BL and sense amplifier 68. Each sense amplifier 68 senses and amplifies the potential difference between a corresponding pair of bit lines BL and /BL.

Decode circuit D1A is provided at a crossing of a line of extension of the arrangement of subword driver circuits S1A–S1D of subword driver S1a–S3a, and a line of extension of the arrangement of sense amplifier blocks 1AS–4DS of the plurality of sense amplifiers 68.

NAND gate 57 receives an output signal of AND gate 49 and a block select signal BS according to a column address (Y address) to provide an equalize control signal BLEQ to the gates of transistors T1, T2 and T3 forming equalize circuits 65 in equalize block E1A. The plurality of equalize circuits 65 in equalize block E1A receives equalize control signal BLEQ from NAND circuit 57 of decode circuit D1A.

AND gate 59 receives a block select signal BS and an output signal from an AND gate 51. Connection control signal BLI is provided to the gates of transistors T4 and T5 in the plurality of connection control circuits 67 in equalize block E1A. More specifically, connection control circuit 67 in equalize block E1A are controlled by AND gate 59 of decode circuit D1A.

NAND gate 61 receives block select signal BS and an output signal from AND gate 53. A P channel sense amplifier activation signal SOP is applied to the plurality of sense amplifiers 68 in sense amplifier block 1AS. NAND gate 63 receives block select signal BS and an output signal from AND gate 55. An N channel sense amplifier activation signal SON is applied to sense amplifiers 68 in sense amplifier block 1AS. The plurality of sense amplifiers 68 in sense amplifier block 1AS are controlled by NAND gates 61 and 63 in decode circuit D1A.

The above description with respect to decode circuit D1A also applies to the other decode circuits D2B–D4D. That is to say, each of decode circuits D1A–D4D controls corresponding equalize blocks E1A–E4D and corresponding sense amplifier blocks 1AS–4DS.

Control circuits 39 functions to control decode circuits D1a–D4d. AND gate 49 receives cache hit signal CH from comparator 37 shown in FIG. 2 and a main equalize control signal MBLEQ according to a row address strobe signal (referred to as "/RAS" hereinafter). AND gate 51 receives cache hit signal CH and a main connection control signal MBLI according to /RAS. AND gate 53 receives cache hit signal CH and a main P channel sense amplifier activation signal MSOP according to /RAS. AND gate 55 receives cache hit signal CH and a main N channel sense amplifier activation signal MSON according to /RAS.

I/O switch 69 is provided corresponding to each sense amplifier 68. Transistors T6 and T7 forming I/O switch 69 are connected in series between bit line BL and bit line/BL. Transistors T6 and T7 have their gates connected to a column select line for receiving a column select signal CS. Transistor T6 has one electrode connected to one of input/output lines I/O1. Transistor T7 has its other electrode connected to the other of input/output line I/O1.

The operation will be described hereinafter. Following data readout from memory cell MC into sense amplifier 68, connection control circuit 67 disconnects bit line pair B1, /BL from sense amplifier 68. Equalize circuit 65 equalizes bit lines BL and /BL. Here, the address of memory cell MC from which data is read out is stored in register 35 shown in FIG. 2. For example, when data is read out from memory cell MC connected to subword line SWL1 driven in response to decode signal X4, an X address (row address), the address of decode signal S4 and the address of block select signal BS according to a Y address (column address) are stored in register 35 shown in FIG. 2.

It is assumed that, subword line SWL1, for example, is selected. In this case, data is read out from all memory cells MC connected to subword line SWL1 to be readout to corresponding bit line pairs BL, /BL and then amplified by a corresponding sense amplifier 68. More specifically, all the data in all memory cells MC connected to one subword line SWL1 in memory array block 10 are read out and held in a corresponding sense amplifier block 1AS.

In the present embodiment, data is stored in a corresponding one of sense amplifier blocks 1AS–4DS for every memory array blocks 10–40. Therefore, sense amplifier blocks 1AS–4DS, i.e. the plurality of sense amplifiers 68 in the block, can be used as a cache memory.

Figure 4:
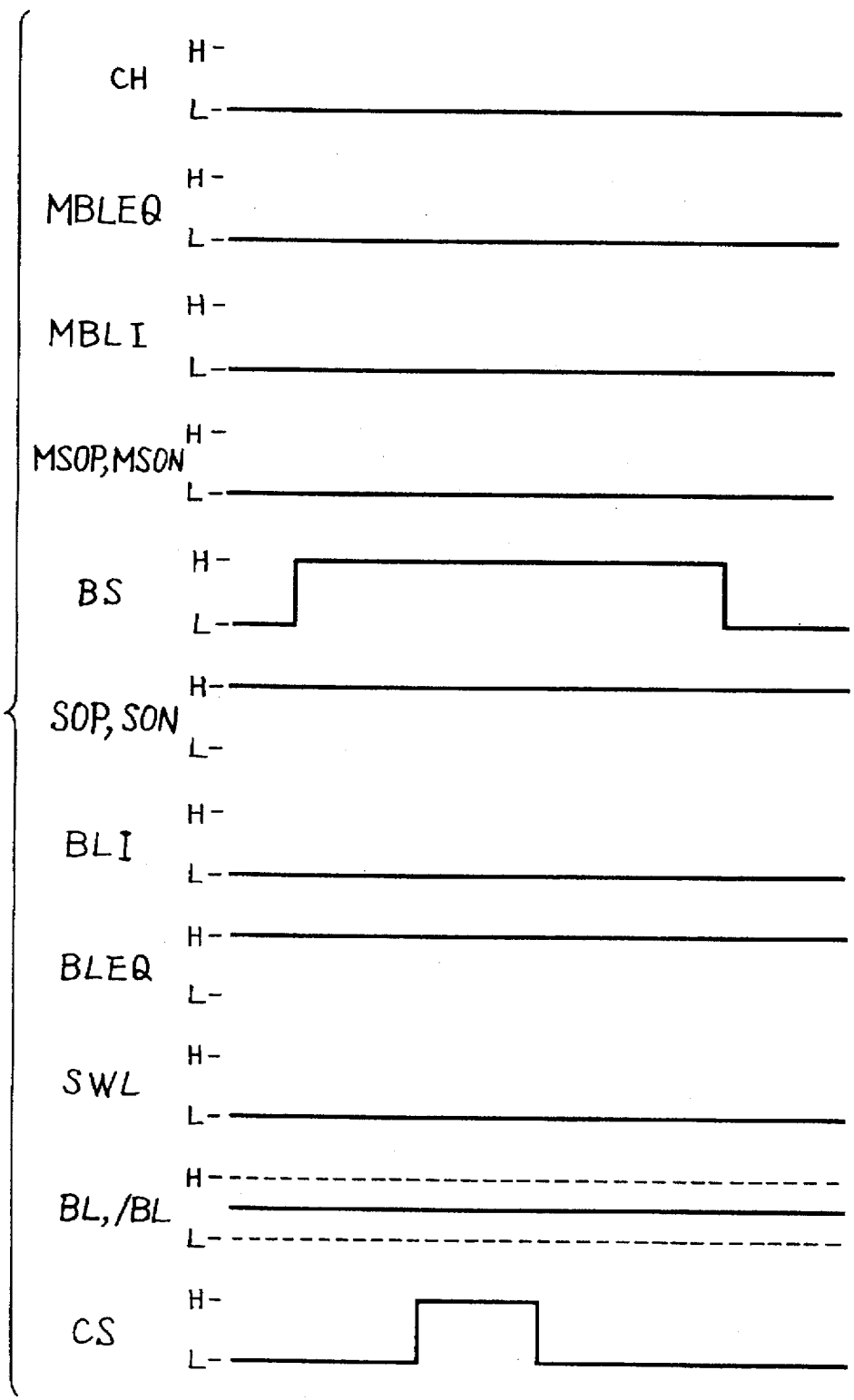
FIGS. 4 and 5 are timing charts of an operation of the DRAM of FIG. 3 in the case of a hit and a miss, respectively, of data of a sense amplifier cache.

FIG. 4 is a timing chart showing an operation of a DRAM of FIG. 3 when there is hit of data in a sense amplifier cache.

Here, attention is focused on memory array block 10 of FIG. 3, and corresponding data circuit D1A, equalize block E1A, and sense amplifier block 1AS. First, it is assumed that data is held in sense amplifier 68.

In this case, as shown in FIG. 4, cache hit signal CH and main connection control signal MBLI of an L level are applied to AND gate 51 of control circuit 39. AND gate 51 provides an output signal of an L level to AND gate 59. Block select signal BS of an L level shown in FIG. 4 is supplied to the other input of AND gate 59. As a result, AND gate 59 provides connection control signal BLI of an L level, shown in FIG. 4, to the gates of transistors T4 and T5. Therefore, bit line pair BL, /BL are disconnected from sense amplifier 68.

As shown in FIG. 4, AND gate 53 of FIG. 3 receives cache hit signal CH and main P channel sense amplifier activation signal MSOP of an L level to provide an output signal of an L level to NAND gate 61 of FIG. 3. Block select signal BS of an L level shown in FIG. 4 is applied to the other input of NAND gate 61. As a result, NAND gate 61 provides a P channel sense amplifier activation signal SOP of an H level to sense amplifier 68. A P channel sense amplifier (not shown) in sense amplifier 68 is activated. The same applies to AND gate 55, NAND gate 63, and the N channel sense amplifier (not shown) in sense amplifier 68.

AND gate 49 shown in FIG. 3 receives cache hit signal CH and a main equalize control signal MBLEQ of an L level, as shown in FIG. 4, to provide an. output signal of an L level to NAND gate 57 of FIG. 3. Block select signal BS of an L level shown in FIG. 4 is applied to the other input of NAND gate 57. NAND gate 57 provides equalize control signal BLEQ of an H level to the gates of transistors T1, T2, and T3. As a result, bit line pair BL, /BL is equalized by equalize circuit 65 to attain an intermediate potential as shown in FIG. 4. This intermediate potential is supplied from a bit line equalize potential supply line VBL connected to transistors T2 and T3.

In FIG. 4 (cache hit), the potential of main word line MWL and potential SWL of subword line SWL are kept at the L level.

When a newly entered address matches the address stored in register 35 of data retained in sense amplifier block 1AS-4DS in comparator 37 as shown in FIG. 2, column select signal CS of an H level is applied to I/O 69 without activating a word line. Data is directly read out from sense amplifier 68. More specifically, following the transition of block select signal BS to an H level, column select signal CS is pulled up in an H level, as shown in FIG. 4.

It is to be noted that cache hit signal CH, main equalize control signal MBLEQ, main connect control signal MBLI, main P channel sense amplifier activation signal MSOP, main N channel sense amplifier activation signal MSON, connection control signal BLI, and potential SWL of subword line SWL remain at the L level, as shown in FIG. 4.

Furthermore, P channel sense amplifier activation signal SOP, N channel sense amplifier activation signal SON, and equalize control signal BLEQ remain at the H level. The pair of bit lines BL and /BL are also maintained at the intermediate level. Sense amplifier blocks 1AS-4BS of FIG. 3 do not have data written out, and still retains the former data.

Figure 5:
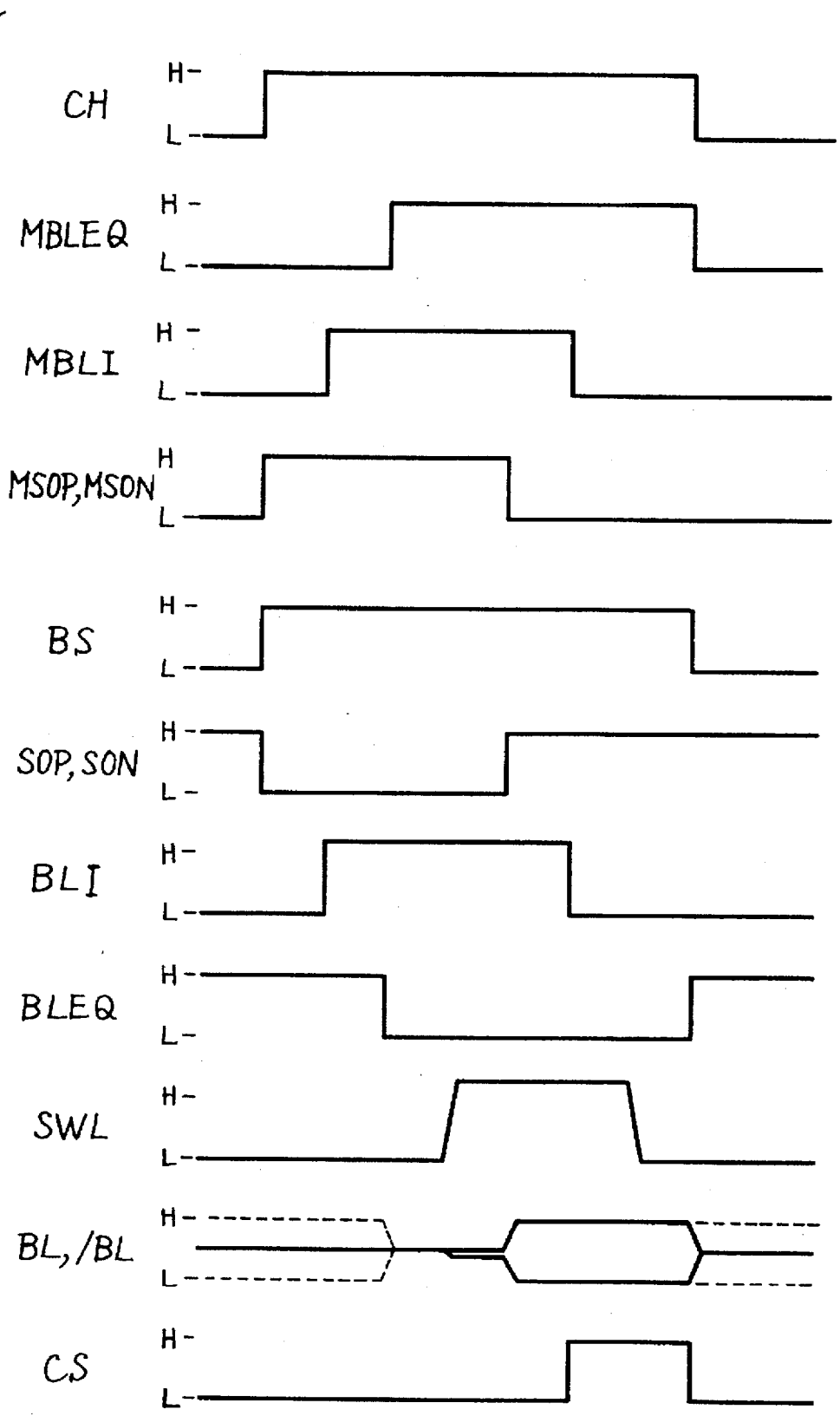

FIG. 5 is a timing chart showing an operation of the DRAM of FIG. 3 in the case of a miss of the data in the sense amplifier cache.

Attention is focused on decode circuit D1A, equalize block E1A, and sense amplifier block 1AS corresponding to memory array block 10 of FIG. 3. The state of data stored in sense amplifier block 1AS is similar to that already described with reference to FIG. 4.

Comparator 37 of FIG. 2 compares a newly input address with the address stored in register 35 of data retained in sense amplifier block 1AS-4DS. Determination is made that there is a cache miss of data in the sense amplifier when the addresses do not match each other. As a result, cache hit signal CH of an H level as shown in FIG. 5 is provided to row decoder unit 41 and control circuit 39 shown in FIG. 2.

AND gate 53 of FIG. 3 receives cache hit signal CH and main P channel sense amplifier activation signal MSOP of an H level, as shown in FIG. 5, to provide an output signal of an H level to NAND gate 61 of FIG. 3. Block select signal BS of an H level shown in FIG. 5 is applied to the other input of NAND gate 61.

NAND gate 61 provides P channel sense amplifier activation signal SOP of an L level as shown in FIG. 5 to the P channel sense amplifier in sense amplifier 68. As a result, the P channel sense amplifier in sense amplifier 68 is inactivated. Similarly, the N channel sense amplifier in sense amplifier 68 receives N channel sense amplifier activation signal SON of an L level shown in FIG. 5 to attain an inactive state.

AND gate 51 of FIG. 3 receives main connection control signal MBLI of an H level shown in FIG. 5. Cache hit signal CH of an H level is applied to the other input of AND gate 51. Therefore, AND gate 51 provides an output signal of an H level to AND gate 59. AND gate 59 receives block select signal BS of an H level as shown in FIG. 5 at its other input, whereby connection control signal BLI of an H level is provided to the gates of transistors T4 and T5. As a result, sense amplifier 68 is connected with bit line pair BL, /BL.

Then, main equalize control signal MBLEQ of an H level shown in FIG. 5 is applied to AND gate 49 of FIG. 3. Cache hit signal CH of an H level is applied to the other input of AND gate 49, whereby an output signal of an H level is provided to NAND gate 57 of FIG. 3. Block select signal BS of an H level shown in FIG. 5 is applied to the other input of NAND gate 57. Therefore, equalize control signal BLEQ of an L level is provided to the gates of transistors T1, T2, T3 of equalize circuit 65. Thus equalize circuit 65 is turned off.

Next, subword line SWL is activated. In this case, the potential of subword line SWL attains an H level as shown in FIG. 5. It is assumed that subword lines SWL1 shown in FIG. 3 is activated. More specifically, subword line SWL1 is the selected line according to the newly input address. Then, data is read out from memory cell MC to bit line pair BL, /BL. Here, a small difference in potential is generated between bit line BL and bit line/BL as shown in FIG. 5.

Then, main P channel sense amplifier activation signal MSOP and main N channel sense amplifier activation signal MSON are pulled down to an L level, and P channel sense amplifier activation signal SOP and N channel sense amplifier activation signal SON are pulled up to an H level, as shown in FIG. 5. More specifically, sense amplifier 68 of FIG. 3 is activated to amplify the small potential difference of bit line pair BL, /BL. Here, sense amplifier 68 still keeps the data.

Main connection control signal MBLI and connection control signal BLI are driven to an L level, whereby transistors T4 and T5 of FIG. 3 are turned off. As a result, sense amplifier 68 is disconnected from bit line pair BL, /BL.

Then, main equalize control signal MBLEQ and equalize control signal BLEQ are driven an L level and an H level, respectively, whereby transistors T1, T2, and T3 of equalize circuit 65 are turned on to equalize bit line pair BL, /BL. Here, P channel sense amplifier activation signal SOP and N channel sense amplifier activation signal SON both attain an H level, and sense amplifier 68 remains activated.

In the present embodiment where one subword line SWL1 in memory array block 10 is selected according to a newly input address, the other sense amplifier blocks 2BS-4DS corresponding to the other memory array blocks 20-40 still retain the data.

Following activation of sense amplifier 68, column select signal CS of an H level is applied to the gates of transistors T6 and T7 of I/O switch 69 of FIG. 3, whereby data of sense amplifier 68 is read out.

Figure 6:
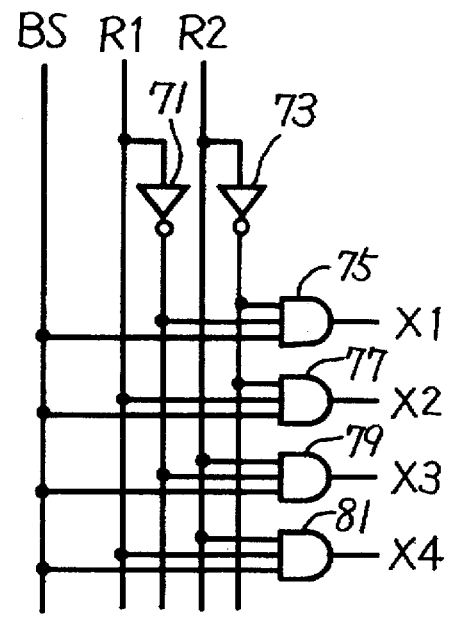
FIG. 6 is a circuit diagram showing in detail a subword driver control circuit for generating decode signals X1–X4 shown in FIG. 4.

FIG. 6 is a circuit diagram showing in detail a word driver control circuit for generating decode signals X1-X4 of FIG. 3.

Referring to FIG. 6, a word driver control circuit includes AND gates 75-81, and inverters 71 and 73. The word driver control circuit receives address signals R1 and R2 according to an input row address (X address), and a block select signal BS according to a column address (Y address).

Address signal R1 is applied to respective input terminals of AND gates 75 and 79 via inverter 71, and also directly to respective input terminals of AND gates 77 and 81. Address signal R2 is applied to respective input terminals of AND gates 75 and 77 via inverter 73, and also directly to respective input terminals of AND gates 79 and 81.

Block select signal BS is applied to respective input terminals of AND gates 75–81, directly. AND gates 75–81 provides decode signals X1–X4, respectively, corresponding to respective inputs.

Figure 7:
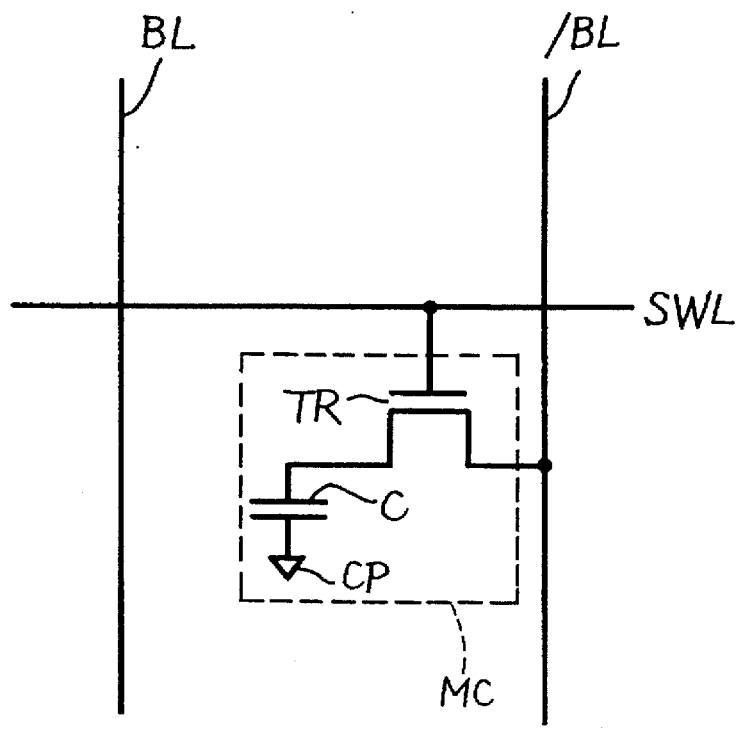
FIG. 7 is a circuit diagram showing in detail a memory cell MC of FIG. 3.

FIG. 7 is a circuit diagram showing in detail a memory cell MC of FIG. 3.

Referring to FIG. 7, memory cell MC includes a transfer gate transistor TR and a capacitor C. Transfer gate transistor TR is connected between one of bit lines BL and /BL and one electrode of capacitor C. Transfer gate transistor TR have its gate electrode connected to subword line SWL. The other electrode of capacitor C is connected to cell plate CP. According to memory cell MC of the above-described structure, data is written to capacitor C or read out therefrom when subword line SWL is activated.

As mentioned before, the present embodiment employs a division word line (DWL) structure and an address non-multiplex system. Therefore, data can be stored in respective sense amplifier blocks 1AS–4DS for every of memory array blocks 10–40. Sense amplifier blocks 1AS–4DS can be used as a cache memory.

Figure 8:
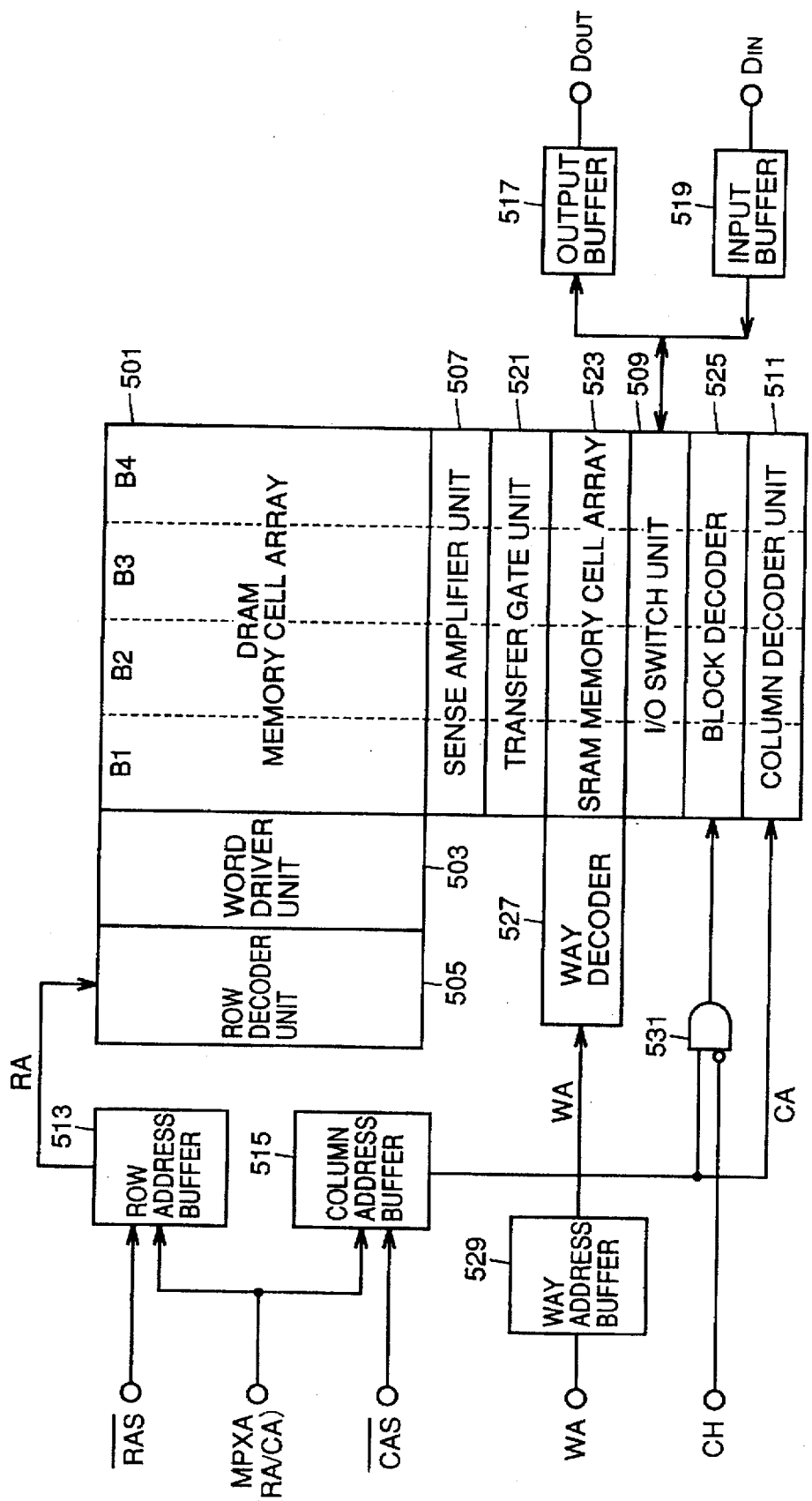
FIG. 8 is a block diagram showing a structure of a conventional DRAM incorporating a cache memory.

According to the present embodiment, it is not necessary to particularly provide SRAM memory cell array 523, way decoder 527 and way address buffer 529 as in the conventional DRAM shown in FIG. 8. Therefore, increase in the chip area and the number of additional signals (output of way decoder, way address, and the like) can be prevented.

Since data for each of memory array blocks 10–40, i.e. for every subword line SWL in each of memory array blocks 10–40 is retained in corresponding sense amplifier blocks 1AS–4DS, the number of ways of a cache is substantially increased. Therefore, the hit rate can be improved.

Furthermore, as shown in FIGS. 4 and 5, column select signal CS is driven to an H level at an faster timing in the case of a cache hit in contrast to the case of a cache miss. Therefore, the time required for activating a main word line, a subword line and sense amplifier 68 in sense amplifier blocks 1AS–4DS can be eliminated to result in a faster readout at subsequent operations. Therefore, high speed access is possible.

Furthermore, the provision of each of decode circuits D1A–D4D at the crossing of a line of extension of the arrangement of the subword driver circuits of corresponding subword drivers S1a–S4a and a line of extension of the arrangement of sense amplifier blocks 1AS–4DS eliminates the need of an additional space for providing decode circuits D1A–D4D. Therefore, increase in the chip area can be prevented.

Thus, a DRAM can be easily implemented as a dynamic semiconductor memory device incorporating a cache memory.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A dynamic semiconductor memory device to which a row address and a column address are entered in parallel with each other, comprising:

a memory cell array divided into a plurality of memory array blocks, each including a plurality of dynamic memory cells, a plurality of main word lines passing through said plurality of memory array blocks, a plurality of bit line pairs provided in a direction crossing said main word lines in each of said plurality of memory array blocks, and connected to a plurality of said memory cells in a corresponding memory array block, wherein each of said plurality of memory array blocks comprises a plurality of subword lines connected to said plurality of memory cells in said each memory array block, and said plurality of subword lines are divided into a plurality of groups, each group of subword lines being provided for a corresponding one of said plurality of main word lines, said memory cell array including a plurality of subword line driver blocks provided corresponding to said plurality of memory array blocks, wherein each of said plurality of subword line driver blocks comprises a plurality of subword line driving circuits provided corresponding to said plurality of subword lines for driving said plurality of subword lines, said dynamic semiconductor memory device further comprising a plurality of sense amplifier blocks provided corresponding to said plurality of memory array blocks, each of said plurality of sense amplifier blocks amplifying a plurality of data read out to said plurality of bit line pairs, and information retain control circuit, wherein said information retain control circuit causes data to be newly read out to a corresponding bit line pair from a memory cell corresponding to an address requested to be accessed so that a corresponding sense amplifier block amplifies and retains the read out data, and still retains a plurality of amplified data in said sense amplifier block corresponding to said memory array block other than the memory array block including said memory cell corresponding to the address that is requested to be accessed, when data corresponding to an address requested to be accessed is not present in any of said plurality of sense amplifier blocks, and still retains a plurality of said sense amplified data present in each of said plurality of sense amplifier blocks, when the data corresponding to the address requested to be accessed is present in any of said plurality of sense amplifier blocks, said dynamic semiconductor memory device further comprising read out means for reading out data retained in said plurality of sense amplifier blocks.

2. The dynamic semiconductor memory device according to claim 1, wherein each of said plurality of sense amplifier comprises a plurality of sense amplifier means provided corresponding to said plurality of bit line pairs connected to the memory cells in said memory array block corresponding to said each of the plurality of sense amplifier blocks, each sense amplifier means for amplifying data read out to said corresponding bit line pair.

3. The dynamic semiconductor memory device according to claim 1, wherein said information retain control circuit inactivates said plurality of main word lines and said plurality of subword lines when data corresponding to the address that is requested to be accessed is present in said plurality of sense amplifier blocks, wherein said readout means reads out data from a relevant sense amplifier block when data corresponding to the address requested to be accessed is present in said plurality of sense amplifier blocks at a timing faster than a case where data corresponding to the address that is requested to be accessed is not present in said plurality of sense amplifier blocks.

4. The dynamic semiconductor memory device according to claim 3, wherein each of said plurality of sense amplifier blocks comprises a plurality of sense amplifier means provided corresponding to said plurality of bit line pairs connected to the memory cells in said memory array block corresponding to said each of the plurality of sense amplifier blocks, each sense amplifier means for amplifying data read out to said bit line pair.

5. The dynamic semiconductor memory device according to claim 3, wherein said information retain control circuit comprises address storage means for storing addresses corresponding to said plurality of data retained in each of said plurality of sense amplifier blocks, and determination means for making determination whether any of the addresses stored in said address storage means matches an address that is requested to be accessed.

6. The dynamic semiconductor memory device according to claim 5, wherein each of said plurality of sense amplifier blocks comprises a plurality of sense amplifier means provided corresponding to said plurality of bit line pairs connected to the memory cells in said memory array block corresponding to said each of the plurality of sense amplifier blocks, each sense amplifier means for amplifying data read out to said bit line pair.

7. The dynamic semiconductor memory device according to claim 5, wherein said information retain control circuit further comprises a plurality of equalize blocks provided between said plurality of memory array blocks and said plurality of sense amplifier blocks, each equalize block equalizing said plurality of bit line pairs connected to the memory cells in a corresponding said memory array block, and equalize block control means for controlling said plurality of equalize blocks according to a result of the determination by said determination means.

8. The dynamic semiconductor memory device according to claim 7, wherein each of said plurality of sense amplifier blocks comprises a plurality of sense amplifier means provided corresponding to said plurality of bit line pairs connected to the memory cells in said memory array block corresponding to said each of the plurality of sense amplifier blocks, each sense amplifier means for amplifying data read out to said bit line pair.

9. The dynamic semiconductor memory device according to claim 8, wherein each of said plurality of equalize blocks comprises a plurality of equalize means connected to said plurality of bit line pairs connected to the memory cells in said memory array block corresponding to said each of the plurality of equalize blocks, each equalize means for equalizing potentials of a corresponding bit line pair, and a plurality of connection control means connected between said plurality of equalize means and corresponding said plurality of sense amplifier means, each connection control means for controlling a connection between a corresponding bit line pair and a corresponding sense amplifier means, wherein said plurality of connection control means, included in one of said plurality of equalize blocks, connect said plurality of bit line pairs connected to the memory cells in said memory array block including the memory cell corresponding to the address that is requested to be accessed with said plurality of sense amplifier means included in a corresponding sense amplifier block when said determination means makes a determination that each of the addresses stored in said address storage means does not match the address that is requested to be accessed.

10. The dynamic semiconductor memory device according to claim 7, wherein said equalize block control means further comprises a plurality of equalize control means provided corresponding to said plurality of equalize blocks, each equalize control means for controlling a corresponding equalize block, wherein one of said plurality of equalize control means causes said equalize block corresponding to a memory array block including the memory cell corresponding to the address that is requested to be accessed to equalize said plurality of bit line pairs connected to the memory cells in said memory array block including said memory cell corresponding to the address that is requested to be accessed when said determination means makes a determination that each of the addresses stored in said address storage means does not match said address that is requested to be accessed.

11. The dynamic semiconductor memory device according to claim 10, wherein each of said plurality of sense amplifier blocks comprises a plurality of sense amplifier means provided corresponding to said plurality of bit line pairs connected to the memory cells in said memory array block corresponding to said each of the plurality of sense amplifier blocks, each sense amplifier means for amplifying data read out to said bit line pair.

12. The semiconductor memory device according to claim 11, wherein each of said plurality of equalize blocks comprises a plurality of equalize means connected to said plurality of bit line pairs connected to the memory cells in said memory array block corresponding to said each of the plurality of equalize blocks, each equalize means for equalizing potentials of a corresponding bit line pairs, a plurality of connection control means connected between said plurality of equalize means and corresponding said plurality of sense amplifier means, each connection control means for controlling a connection between corresponding bit line pair and a corresponding sense amplifier means, wherein said plurality of connection control means, included in one of said plurality of equalize blocks, connect said plurality of bit line pairs connected to the memory cells in said memory array block including the memory cell corresponding to the address that is requested to be accessed with said plurality of sense amplifier means included in a corresponding sense amplifier block when said determination means makes a determination that each of addresses stored in said address storage means does not match the address that is requested to be accessed.

13. The dynamic semiconductor memory device according to claim 10, wherein each of said plurality of equalize control means is provided at a crossing between a line of extension of arrangement of said plurality of subword line driving circuits in a corresponding subword line drive block and a line of extension of arrangement of said plurality of equalize blocks.

14. A dynamic semiconductor memory device receiving a row address and a column address in parallel with each other, comprising:

- a memory cell array having a plurality of memory array blocks each including a plurality of dynamic memory cells arranged in rows and columns, said plurality of memory array blocks being arranged along a row direction of said memory cells, each of the memory array blocks further including a plurality of subword lines provided corresponding to the rows of the memory cells in said each of the memory array blocks and including a plurality of bit line pairs provided corresponding to the columns of the memory cells in said each of the memory array blocks;
- a plurality of main word lines each disposed along said row direction and passing through said plurality of memory array blocks;
- a plurality of subword line drivers corresponding to said plurality of subword lines respectively, each corresponding to one of said plurality of main word lines, and each driving a corresponding subword line in response to a potential of a corresponding main word line;
- a plurality of sense amplifier blocks corresponding to said plurality of memory array blocks respectively, each of said plurality of sense amplifier blocks including a plurality of sense amplifiers coupled to the plurality of bit line pairs in a corresponding memory array block respectively, said plurality of sense amplifier blocks being responsive to a plurality of sense amplifier activation signals respectively, each of said plurality of sense amplifiers in response to a corresponding sense amplifier activation signal for amplifying and holding data read out to a corresponding one of said bit line pairs;
- a plurality of transfer gate blocks corresponding to said plurality of memory array blocks respectively, each of said plurality of transfer gate blocks including a plurality of transfer gate pairs coupled between the plurality of bit line pairs in a corresponding memory array block and the plurality of sense amplifiers in a corresponding sense amplifier block, each of said plurality of transfer gate blocks in response to a corresponding one of a plurality of bit line isolation signals for connecting the plurality of bit line pairs in a corresponding memory array block with the plurality of sense amplifiers in a corresponding sense amplifier block, said plurality of bit line isolation signals corresponding to said plurality of transfer gate blocks respectively;
- data hold control circuit for generating said plurality of sense amplifier activation signals and said plurality of bit line isolation signals, and for controlling said plurality of transfer gate blocks and said plurality of sense amplifier blocks so that
  (a) when one of said plurality of sense amplifier blocks holds data corresponding to an access address that is requested to be accessed,
    said plurality of transfer gate pair in said plurality of transfer gate blocks isolate said plurality of bit line pairs from said plurality of sense amplifiers and
    said plurality of sense amplifiers in said plurality of sense amplifier blocks keep holding data, and
  (b) when said plurality of sense amplifier blocks hold data different from data corresponding to the access address,
    the plurality of transfer gate pairs in one of said plurality of transfer gate blocks connect the plurality of bit line pairs in a memory block including a memory cell corresponding to the access address with the plurality of sense amplifiers in a corresponding one of said sense amplifier blocks,
    the connected plurality of sense amplifiers stop holding data, and amplify and hold data newly read out to the corresponding bit lines,
    the plurality of transfer gate pairs in the other of said plurality of transfer gate blocks isolate a corresponding plurality of bit line pairs from a corresponding plurality of sense amplifiers, and
    the plurality of sense amplifiers in the other sense amplifier blocks keep holding data; and
  a read out circuit for reading out data corresponding to the access address from said plurality of sense amplifiers.

15. The dynamic semiconductor memory device according to claim 14, further comprising:

a plurality of equalize blocks each including a plurality of equalize circuits connected to said plurality of bit line pairs respectively, each of said plurality of equalize circuits coupled to a corresponding sense amplifier through a corresponding transfer gate pair.

* * * * *